(12) United States Patent
Nguyen (10) Patent No.: US 12,155,952 B2
(45) Date of Patent: Nov. 26, 2024

(54) SAMPLE AND HOLD READOUT SYSTEM AND METHOD FOR RAMP ANALOG TO DIGITAL CONVERSION

(71) Applicant: OmniVision Technologies, Inc., Santa Clara, CA (US)

(72) Inventor: Trung Thanh Nguyen, Oslo (NO)

(73) Assignee: OmniVision Technologies, Inc., Santa Clara, CA (US)

(*) Notice: Subject to any disclaimer, the term of this patent is extended or adjusted under 35 U.S.C. 154(b) by 182 days.

(21) Appl. No.: 17/715,780

(22) Filed: Apr. 7, 2022

(65) Prior Publication Data
US 2023/0328407 A1 Oct. 12, 2023

(51) Int. Cl.
| | |
|---|---|
| *H04N 25/772* | (2023.01) |
| *H03M 1/12* | (2006.01) |
| *H03M 1/34* | (2006.01) |
| *H03M 1/56* | (2006.01) |
| *H04N 25/75* | (2023.01) |
| *H04N 25/778* | (2023.01) |

(52) U.S. Cl.
CPC ........ *H04N 25/772* (2023.01); *H03M 1/1265* (2013.01); *H03M 1/34* (2013.01); *H03M 1/56* (2013.01); *H04N 25/778* (2023.01); *H04N 25/75* (2023.01)

(58) Field of Classification Search
CPC .... H04N 25/772; H04N 25/778; H04N 25/75; H04N 25/616; H04N 25/78; H03M 1/1265; H03M 1/34; H03M 1/56; H03M 1/1245; H03M 1/1295; H03M 1/468; H03M 1/22
See application file for complete search history.

(56) References Cited

U.S. PATENT DOCUMENTS

| | | | |
|---|---|---|---|
| 2011/0149136 A1* | 6/2011 | Johnson | H04N 25/75 348/308 |
| 2015/0170760 A1* | 6/2015 | Nardi | G11C 27/02 327/94 |
| 2018/0098015 A1* | 4/2018 | Lee | H04N 25/75 |
| 2023/0420482 A1* | 12/2023 | Tochigi | H04N 25/778 |

* cited by examiner

*Primary Examiner* — Michael E Teitelbaum
(74) *Attorney, Agent, or Firm* — COZEN O'CONNOR (57) ABSTRACT

A sample and hold readout system and method for ramp analog to digital conversion is presented in which an optical array is read out using a sample and hold circuit such that each sample is used to charge a sample and hold capacitor and is read out during a hold phase using an amplifier that drives an ramp analog to digital converter. The sample and hold circuit transitions to a tracking phase wherein the optical array input drives an amplifier that drives the sample and hold capacitor then transitions to a sample phase where the sample and hold capacitor is connected to the optical array output directly.

9 Claims, 12 Drawing Sheets

SAMPLE AND HOLD READOUT SYSTEM AND METHOD FOR RAMP ANALOG TO DIGITAL CONVERSION

BACKGROUND

Optical sensors are made up of cells or pixels that store an amount of charge determined by light exposure. An image is formed from an array of pixels that are exposed to light from a scene. In order to read the image that was generated, the charge stored on the array of pixels needs to be read out. A common method is to sample each pixel by allowing it to charge a device such as a capacitor then to convert the voltage of the capacitor using an analog to digital converter or ADC. A common technique for the conversion from analog to digital is by using a Ramp ADC. A Ramp ADC is one that presents the voltage to be converted to an input of a comparator. The other comparator input is fed by a digital to analog converter that is driven digitally by a counter. The counter counts until the comparator trips. When the comparator trips, the counter is stopped, and the value of the counter is saved as the digital equivalent representation of the voltage being converted. A simplified representation of the system is shown in FIG. 1.

Figure 1:
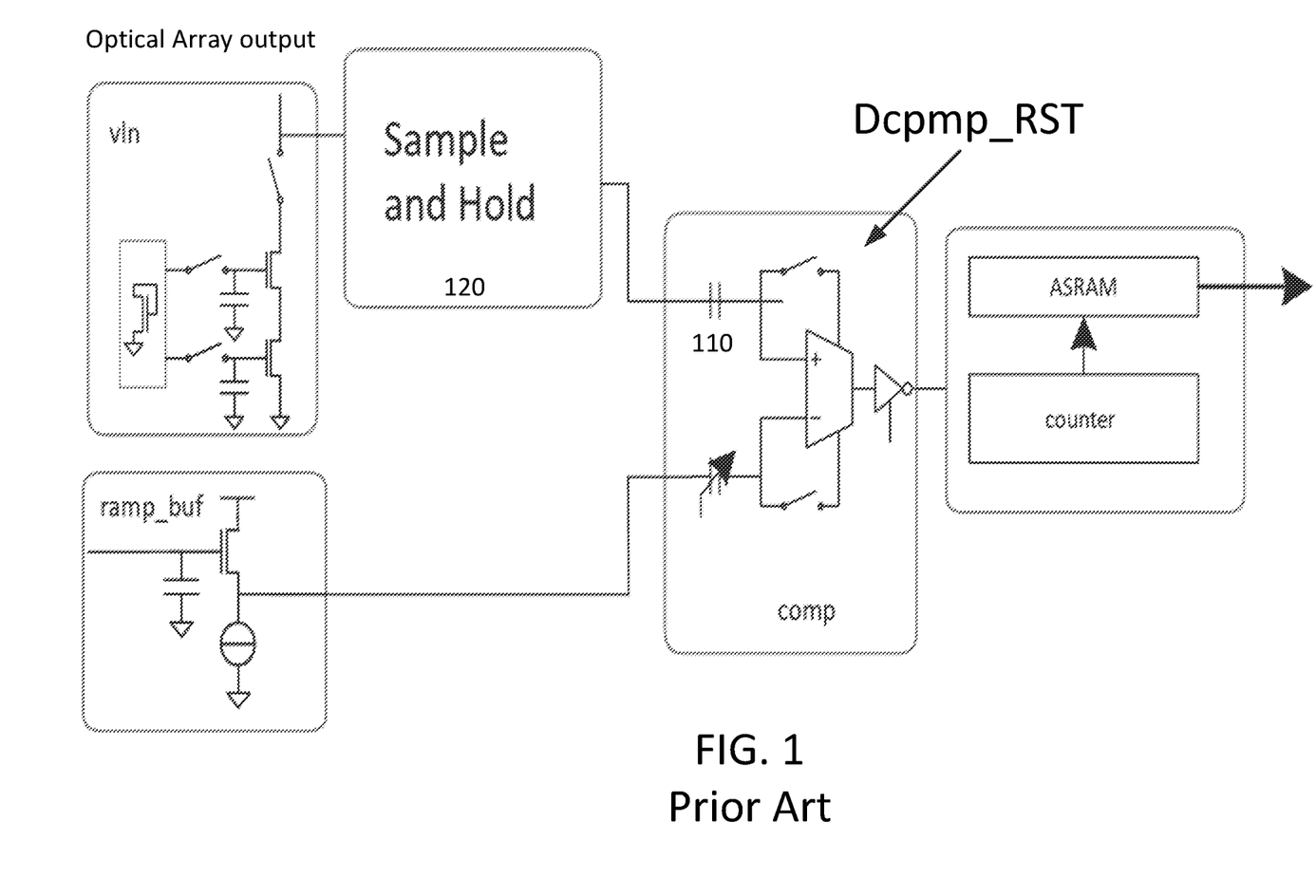
FIG. 1 is a prior art block diagram of an optical array sense and readout electronics.

FIG. 1 is a prior art block diagram of an optical array sense and readout electronics. It shows an optical array output electrically coupled to a Sample and Hold Circuit 120. The Sample and Hold Circuit is electrically coupled to a comparator (comp). The comparator also has an input that is electrically coupled to a ramp buffer (ramp_buf) the buffered output of a digital to analog converter (not shown). When the comparator triggers (the two inputs are equal) the value of the counter that drives the digital to analog converter is stored in memory (ASRAM). The comparator capacitor 110 is discharged or reset by the assertion of a control called Dcpmp_RST.

Figure 2:
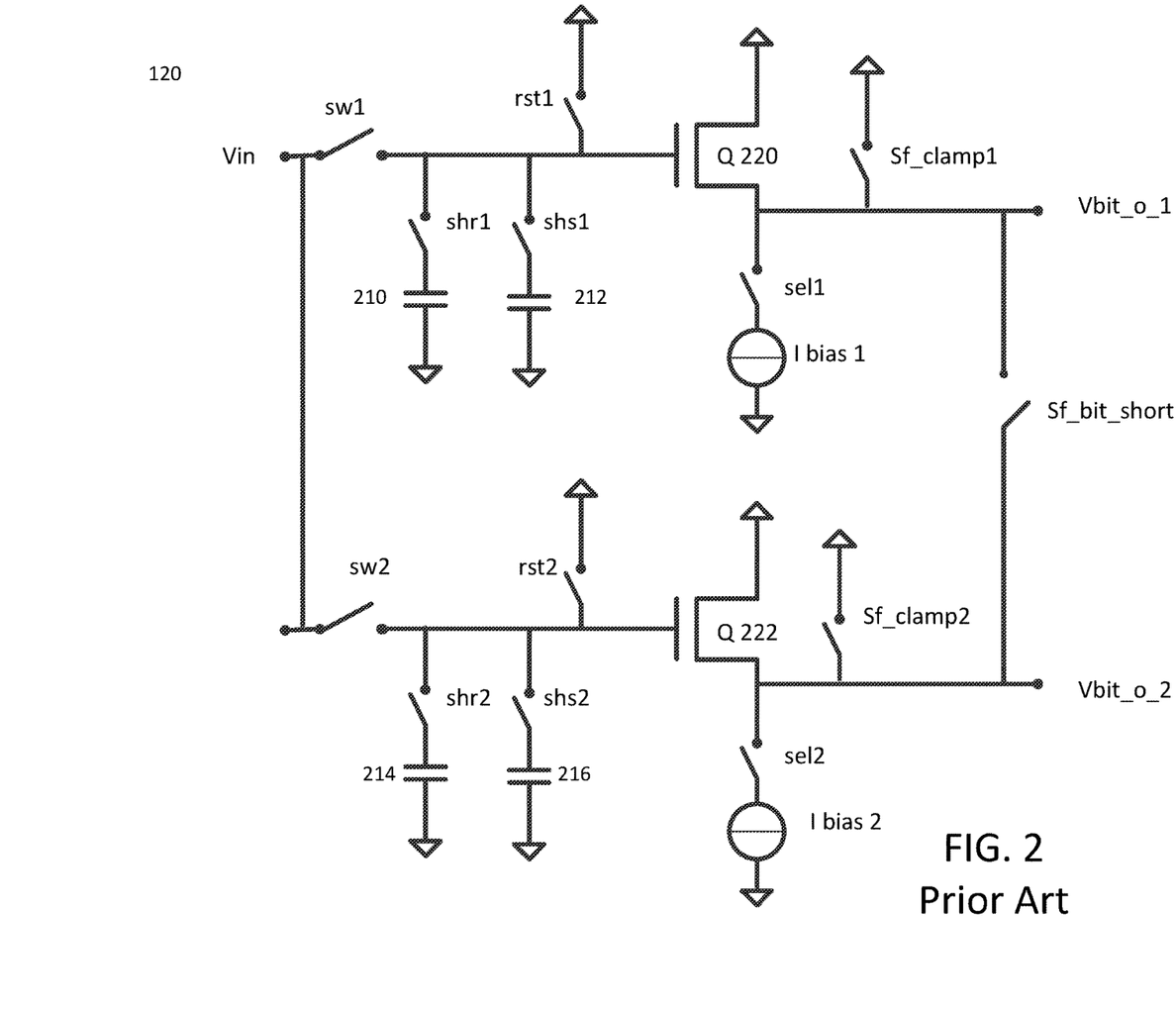
FIG. 2 is a schematic of a Sample and Hold circuit of FIG. 1.

FIG. 2 is a schematic of a Sample and Hold circuit of FIG. 1. FIG. 2 shows two identical branch circuits so that pixels can be read and converted in a pipeline fashion.

Figure 3:
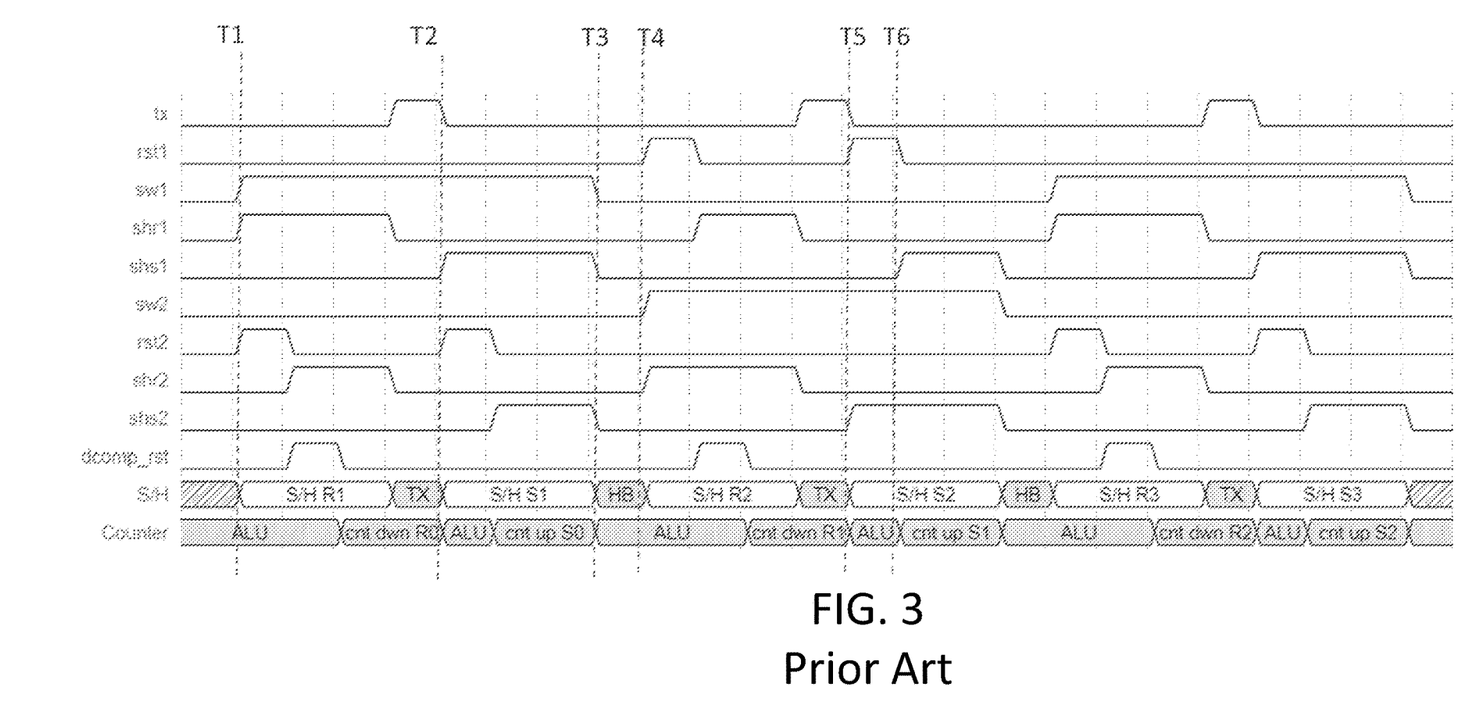
FIG. 3 is a timing diagram for the circuit of FIG. 2.

FIG. 3 is a timing diagram for the circuit of FIG. 2 that may be used to understand the process of sample and hold that takes place in the sample and hold circuit. The timing begins with closing sw1 with sw2 open (T1) so that only the top half of the circuit is connected to the input. At time T1 rst2 is also asserted. Capacitor 210 is connected to Vin via switch shr1 to sample the reset value (R1) of row 1. The charge is held in capacitor 210 until it is read out and converted. The Switch shr1 is opened and shs1 is then closed at (T2) connecting 212 to the input Vin to sample the signal value of row 1(S1). When sw1 opens (T3) the two capacitors connected to shr1 and shs1 210 and 212 hold the pixel reset and signal of row 1. The ADC converting of pixel row 1 starts with rst1 pulse (T4) to clear the sampling node in the top branch. Also at T4 sw2 is closed starting the sampling of R(2). Shr1 is closed again to connect capacitor 210 to the gate of the FET Q220 in a source follower configuration. The reset value is held and converted by counting the digital input to the DAC. When the output of the DAC is equal to the value of the sample, the value of the pixel is stored. The opposite state is true for the bottom circuit connected to sw2. When s1 is closed, s2 is open and 214 and 216 are in their own hold state converting samples acquired in the previous sample phase shown as count down R0 and count up S0. When s1 opens s2 (T3) closes and samples the next two pixels. The same readout sequence for the pixel signal is followed, starting with rst1 pulse(T5) to clear out the sampling node in the top branch. The shs2 switch is closed (T6) to connect capacitor 212 to the source follower Q220.

The upper and lower circuit each in turn driving their respective transistors 220 and 222 each are configured as a source follower driving the output. Thus, sample and holds are performed by the two circuits connected to sw1 and sw2 in a fashion that lets one circuit sample while the other circuit holds and reads out the results. They each have their own source follower that can drive the output.

The previous example shows two sample and hold branches, each with one sample and hold capacitor for the shr signal and one sample and hold capacitor used for the shs signal. The two sample and hold branches operate in pipeline mode: one branch is sampling signal of one channel while other branch is outputting signal of the other channel to ADC for conversion. The disadvantages of this approach are that it requires a large area of chip space. It is also prone to mismatch between shr and shs sample and hold capacitors 210 and 212 in one branch and 214 and 216 in the other. Samples are driven through a different transistor 220 and 222 each configured as source follower amplifiers. The additional electronics requires more power to operate.

SUMMARY OF THE EMBODIMENTS

In an embodiment, a sample and hold circuit is used to sample and hold samples from an optical array in three phases. The hold phase is a phase that transfers the value of a charged sample and hold capacitor by using the capacitor voltage to drive the input of an amplifier. The output of the amplifier is driving the input to a ramp ADC. At the completion of the hold phase the input of the amplifier is switched to an optical array output to start a tracking phase. The output of the amplifier is also electrically coupled to the sample and hold capacitor which starts charging the capacitor to a new optical array input. The tracking phase is followed by the sample phase where the sample and hold capacitor is electrically connected to the optical array output, and the amplifier output is connected to the input to an ADC. In embodiments the amplifier is a Field Effect Transistor based source follower with zero threshold voltage.

DETAILED DESCRIPTION OF THE EMBODIMENTS

Figure 4A:
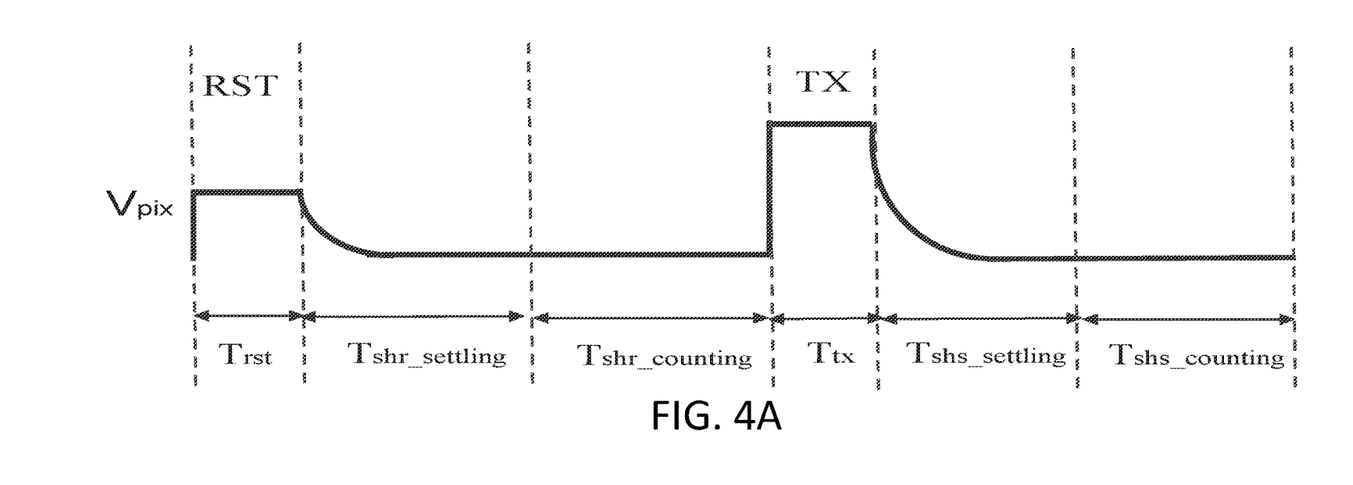
FIG. 4A is a timing diagram for conversion times in a sample and hold circuit without pipelining, in embodiments.

FIG. 4A is a timing diagram for conversion times in a sample and hold circuit without pipelining FIG. 1*t* shows the timing of converting two successive pixels which will be referred to as shr and shs. The timing is shown for the sample and hold and conversion without pipelining. The timing begins with an RST pulse or reset which lasts for a period $T_{RST}$. The shr signal is then sampled which requires a settling time $T_{shr\_settling}$ and is then converted by being compared with the DAC being driven by a counter for a period of $T_{shr\_counting}$. At the end of the counting period, the conversion of shr is complete and a TX charge transfer pulse is asserted for a period of $T_{tx}$. After the TX pulse the shs signal requires settling for a period of $T_{shs\_settling}$. When the signal is fully settled a conversion takes place in which it is compared with a DAC output being driven by a counter and lasts for a period of $T_{shs\_counting}$. At the end of the counting period the signal is converted and the cycle begins again with a reset pulse for a new value for the shr. The time required for the two conversions that which we call row time or $T_{row}$ is:

$$T_{row} = T_{rst} + T_{shr\_settling} + T_{shr\_counting} + T_{tx} + T_{shs\_settling} + T_{shs\_counting}$$

The row time limits how quickly the pixel array and frame rate may be converted to a digital image. Consequently, the frame rate is limited by the row time so one way to increase the frame rate is to reduce the row time.

Figure 4B:
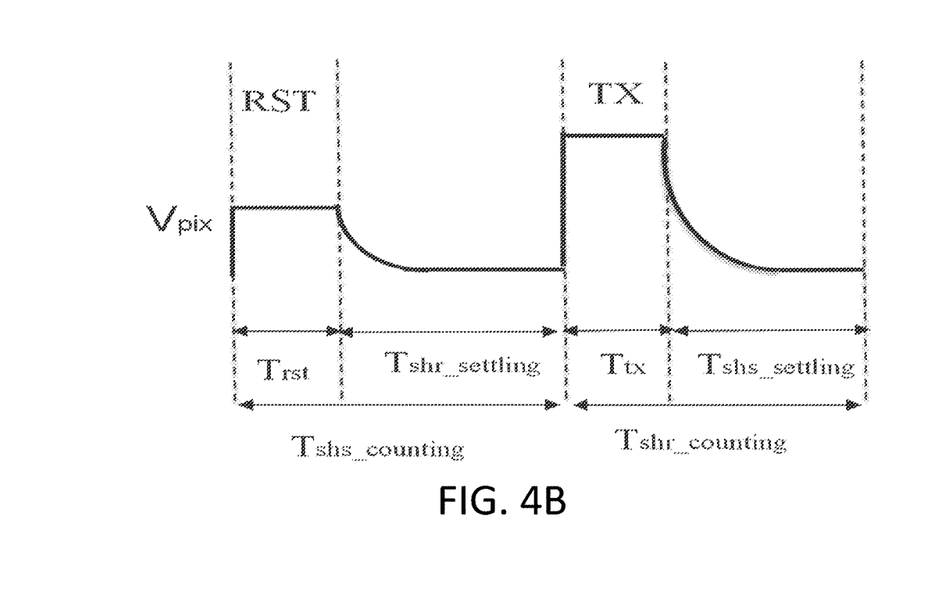
FIG. 4B is a timing diagram for conversion times in a sample and hold circuit using pipelining, in embodiments.

FIG. 4B is a timing diagram for conversion times in a sample and hold circuit using pipelining. As can be seen the counting occurs in parallel with the sampling and settling of the prior pixel. While shr is being sampled the prior shs is being converted or counted. So that the operation can be done at a much faster rate. The row time can be expressed as:

$$T_{row} = T_{RST} + T_{shr\_settling} + T_{TX} + T_{shs\_settling}$$

Figure 5A:
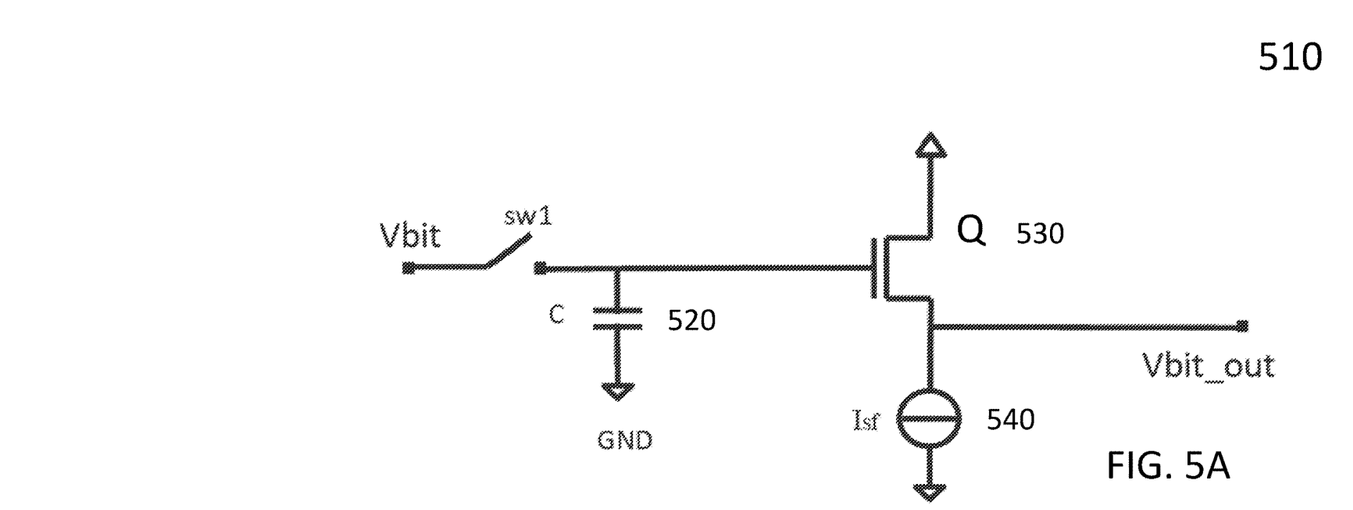
FIG. 5A is an embodiment of a sample and hold circuit.

FIG. 5A shows a schematic of a sample and hold circuit 510. It is electrically coupled to the input Vbit which is electrically coupled to a switch sw1. Vbit represents an output from an optical array. The other end of sw1 is electrically coupled to a capacitor 520. The capacitor is also electrically coupled to the gate of a FET Q 530 which is configured as a source follower. The capacitor is connected to switch sw1 and the gate on one side and the other side of 520 is connected to ground. The source of the transistor 530 is the output Vbit_out. The source is also electrically coupled to a biasing current source 540 with a drive current Isf which in turn is electrically coupled to ground.

Figure 5B:
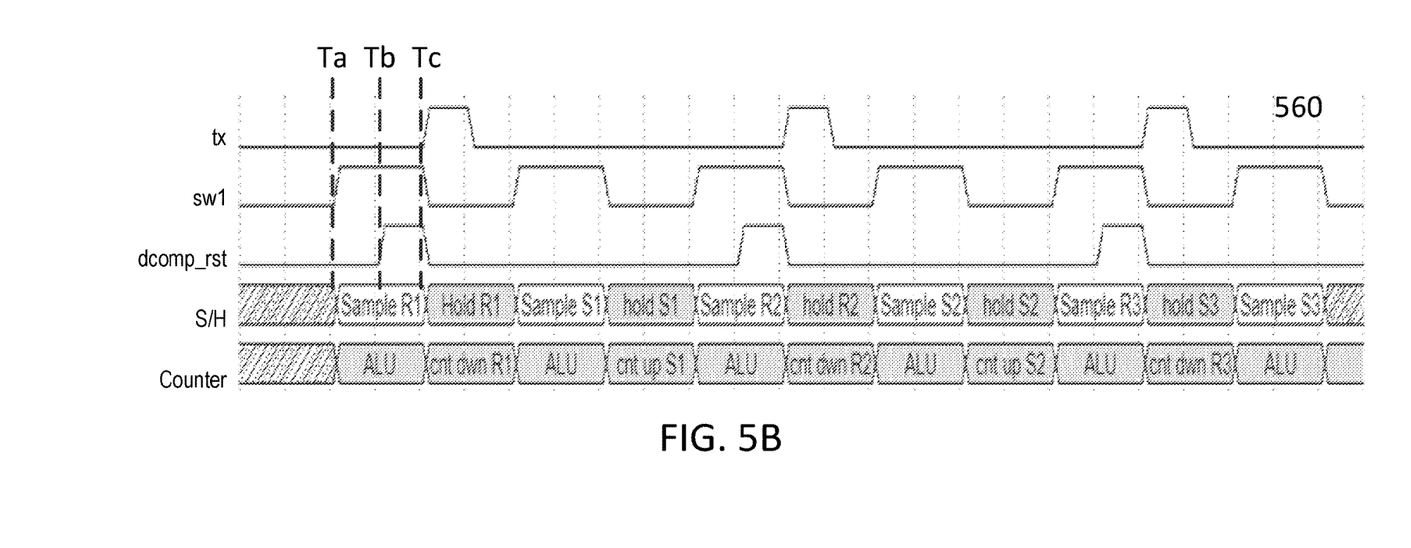
FIG. 5B is a timing diagram for the circuit in FIG. 5A

FIG. 5B shows a timing diagram 560 including the signals tx or charge transfer, sw1 the state of switch sw1, dcomp_rst which resets the comparator capacitor as in FIG. 1. The state of sample and hold circuit 510 is shown by signal S/H and the counter from the ramp DAC (as shown in FIG. 1) is also shown. The switch sw1 is closed at the beginning of the cycles shown as (Ta), closing the switch connecting the capacitor 520 to Vbit and allowing it to charge to the value of Vbit. As it stabilizes dcomp_rst is asserted (Tb) and is dis-asserted (Tc) simultaneously with the opening of sw1. From Ta to Tc is the sampling time. While sw1 is open the charged output or charge transfer is accomplished. Vbit_out represents the voltage of the capacitor which is the value of the pixel sampled. The time that sw1 is open is the hold period. A second sampling then occurs where sw1 is closed again and the capacitor comes to equilibrium to the new voltage. When opened it is held again for transfer to Vbit_out. The first sample is the R while the second sampling is the S. It is therefore a sample of R followed by a hold of R. A sampling of S follows with a hold of S. In the diagram they are marked by a Sample R1, Hold R1, Sample S1, Hold S1. Each sample being followed by a respective hold. In each cycle the counter counts down through each R sample followed by the counter counting up to each consecutive S. The counting is the conversion to a digital representation of the sample being held. The sampling in this example is done serially. FIG. 5A is the sample and hold circuit that processes the image pixel by pixel.

Figure 6:
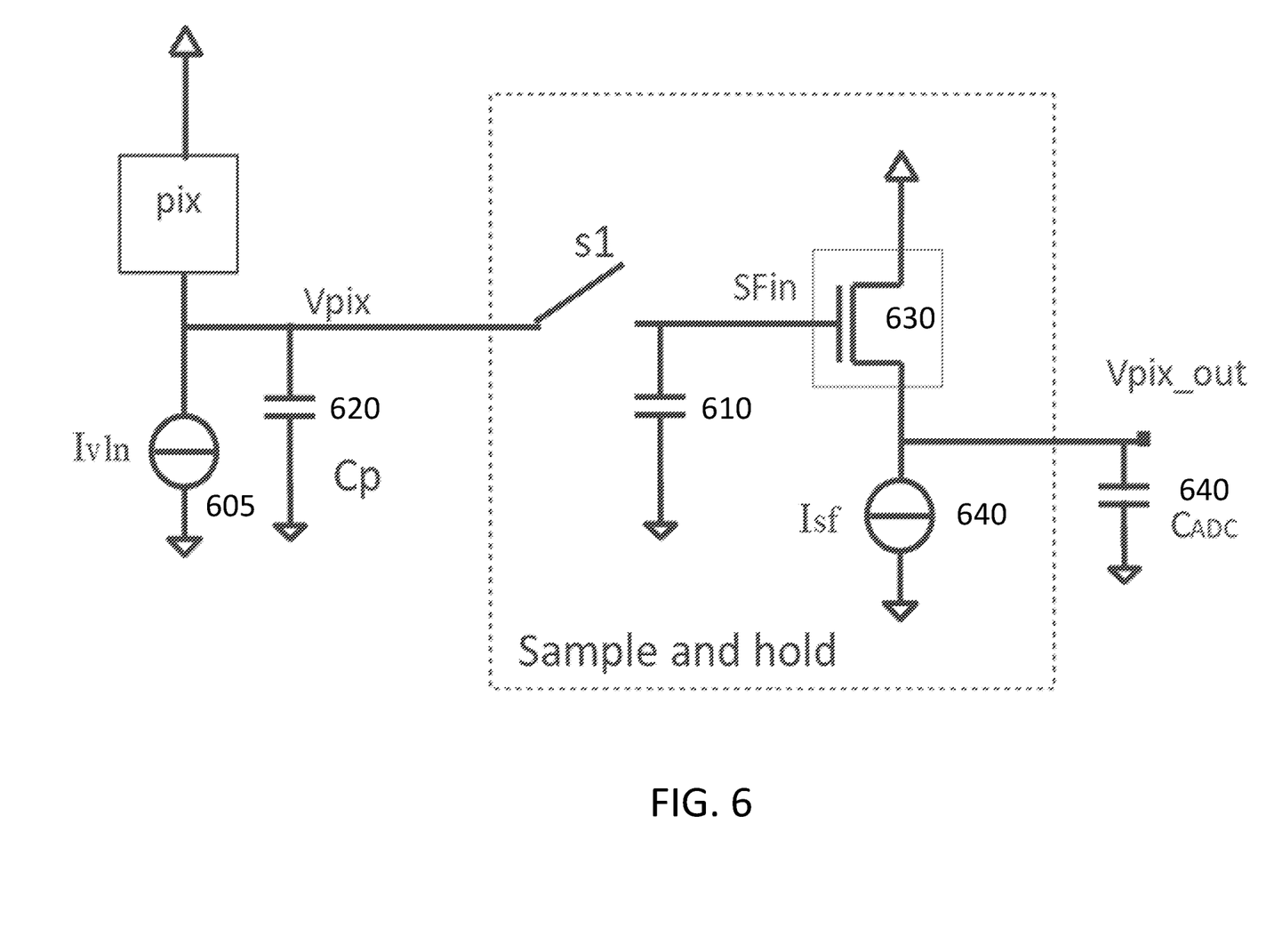
FIG. 6 is a model of the sample and hold circuit of FIG. 5A.

FIG. 6 shows the circuit of FIG. 5A with its parasitic capacitances. The optical array has an output capacitance and is shown as $C_P$ and is driven by a current source 605 with a magnitude Ivin. The input to the ADC has an input impedance and is represented by $C_{ADC}$. The circuit has a sample and hold capacitor 610 and a transistor 630 along with a bias current source 640 driven with a magnitude of Isf. The circuit shown in FIG. 6 represents a model used for a simulation shown in FIG. 7.

Figure 7:
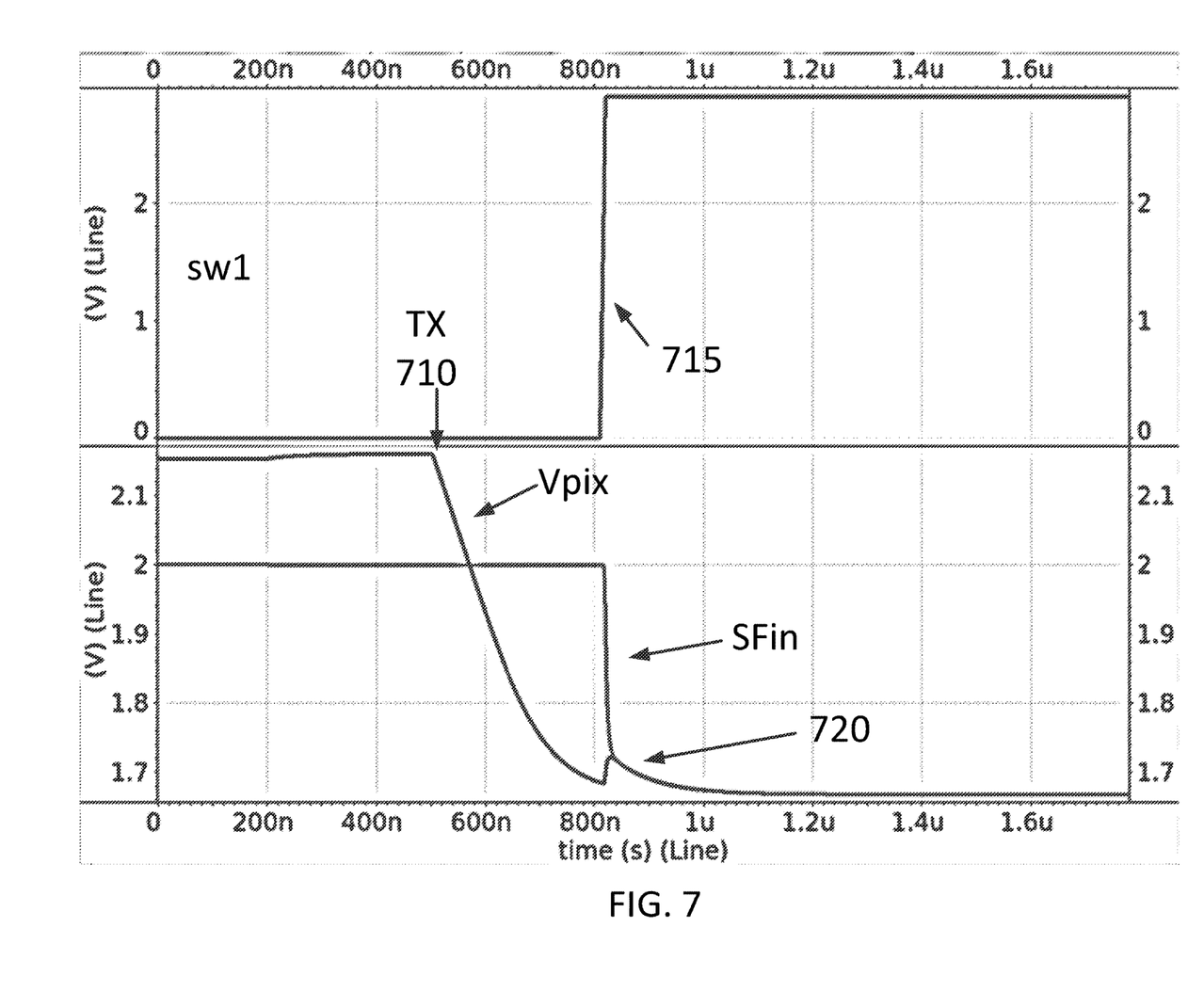
FIG. 7 shows a simulation output of the circuit model if FIG. 6.

FIG. 7 shows a simulation of the circuit of FIG. 6 where $C_P$ has a value of 1.5 pF, Ivin is 4 uA, Isf is 1.5 uA, C 610 is 0.3 pF and $C_{ADC}$ IS 0.4 pF. Initially sw1 is open. At the end of TX 710 Vpix starts to decay. It decays to a settled value until switch sw1 is closed (715) and charge is transferred from Cp to the sample and hold capacitor 610. The transfer causes a small transient or "bump" 720, and it take some more time for Vpix to be settled again before its value is hold on capacitor 610. This point is the transition from hold to sample.

Figure 8A:
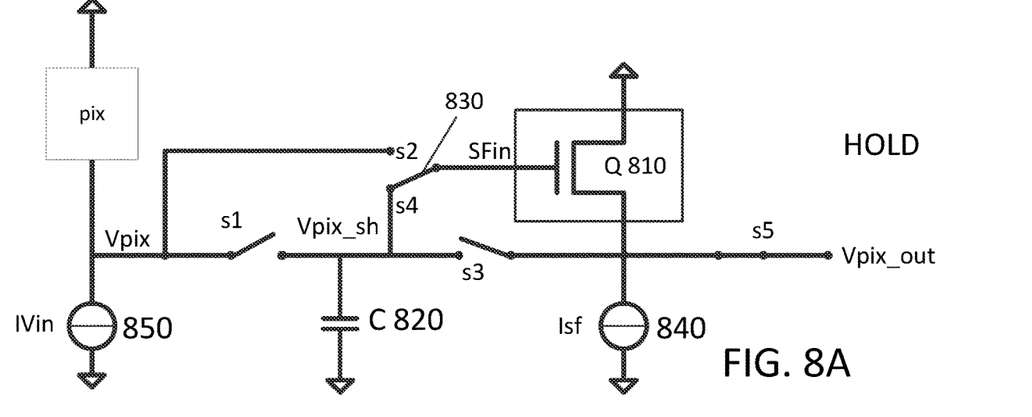
FIG. 8A shows an embodiment of a sample and hold circuit during the hold phase.
Figure 8B:
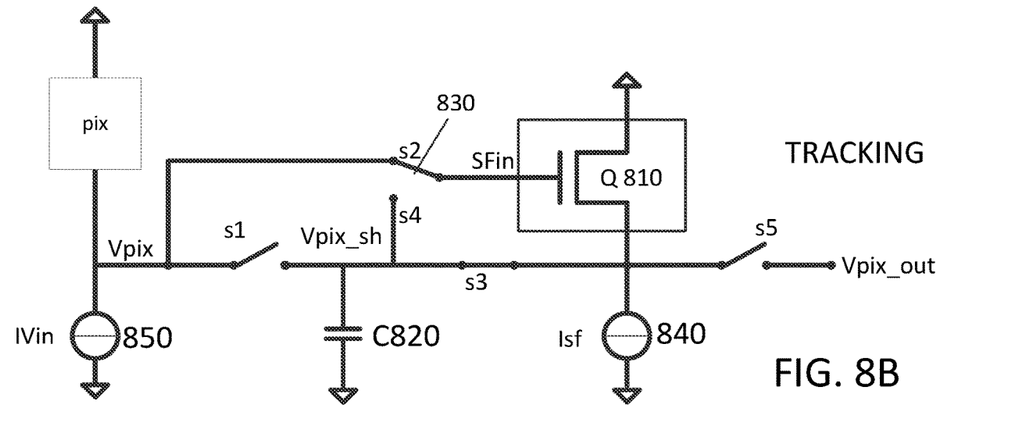
FIG. 8B shows the sample and hold circuit of FIG. 8A during the tracking phase.
Figure 8C:
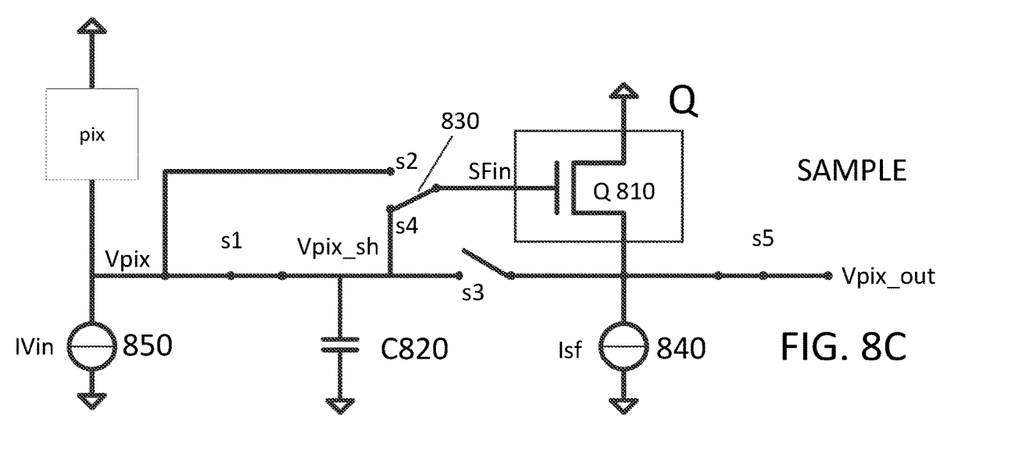
FIG. 8C shows the sample and hold circuit of FIG. 8A during the sample phase.

FIGS. 8A, 8B, and 8C show a sample and hold circuit in three phases of operation, Hold in FIG. 8A, Tracking in FIG. 8B and Sample in FIG. 8C. The circuit has an input from an optical array which is selectable so that a pixel can be connected to the circuit and is represented by Vpix. The optical array input is biased by current source 850 at a magnitude of Ivin. The input Vpix is switched, shown as s1, and can be electrically coupled or uncoupled to a sample and hold capacitor 820. There is a transistor Q 810 which is configured as a source follower. The drain is connected to power and the input or gate is labelled as SFin electrically coupled to a switch 830 than is configured to connect SFin to Vpix shown as position s2 or it can be configured so that SFin is connected to Vpix_sh shown as s4. The third switch s3 which electrically couples or decouples the output of the amplifier output to the sample and hold capacitor Vpix_sh. A fourth switch s5 electrically couples and couples the output of the amplifier to the output of the sample and hold circuit $V_{pix\_out}$.

FIG. 8A shows the HOLD phase when the switch s1 is open, and the capacitor 820 is electrically coupled to the input SFin via 830 connected to s4. SFin drives the gate of Q 810 whose drain is connected to power. The transistor Q 810 is a FET configured as a source follower amplifier. The source of Q 810 is biased by the current source 840 with a magnitude of Isf. The source of Q 810 is electrically coupled to the output Vpix_out through the closed switch s5. S3 is open so that the capacitor 820 is isolated and retains its charged value. The source follower has unity gain. Vpix_out will be equal to the input SFin which is electrically coupled to the capacitor C 820 and is the value of Vpix_sh. Vpix_out will be equal to Vpix_sh during the hold phase.

During the Tracking phase as shown in FIG. 8B, the switch s1 is open. Vpix is connected, through switch 830 connected to s2, to SFin which is the gate with Q 810 configured as a source follower. The gate of 810 is the amplifier input. The drain of the transistor Q 810 is connected to power and the source is electrically coupled to a biasing current source 840 at a magnitude of Isf. The source follower is an amplifier with unity gain. The source is also electrically coupled to Vpix_sh through closed switch s.3 The gate of Q 810 which is the amplifier input is electrically coupled to Vpix so that the capacitor C 820 is charging to the value Vpix. S5 is open so the output Vpix_out is disconnected. The voltage of the sample and hold capacitor 820 is tracking the value of Vpix.

During the Sample phase shown in FIG. 8C Vpix is electrically coupled to Vpix_sh through the closed switch s1 and is also electrically coupled, via switch 830 connected to s4, to the input SFin of the amplifier input. SFin is the input to the gate of Q810 which is configured as a source follower. The drain of Q 810 is connected to power and the source is electrically coupled to the current source 840 at a magnitude of Isf. The source of 810 is also connected to the output, via a closed s5, Vpix_out.

The output of the sample and hold circuit drive the input to a comparator of a ramp ADC. During the Hold phase, the voltage of the sample and hold capacitor is presented through an amplifier to the input of the comparator. The other comparator input is driven by a DAC that is connected to a counter that counts up or counts down until the two values are equal. When the two values are equal the comparator trips and the counter is stopped. The value of the counter is stored in memory as the digital representation of the analog signal. When the conversion is complete a signal dcpm_rst, as in FIG. 1, is asserted so that any storage circuit within the comparator is cleared.

Figure 9:
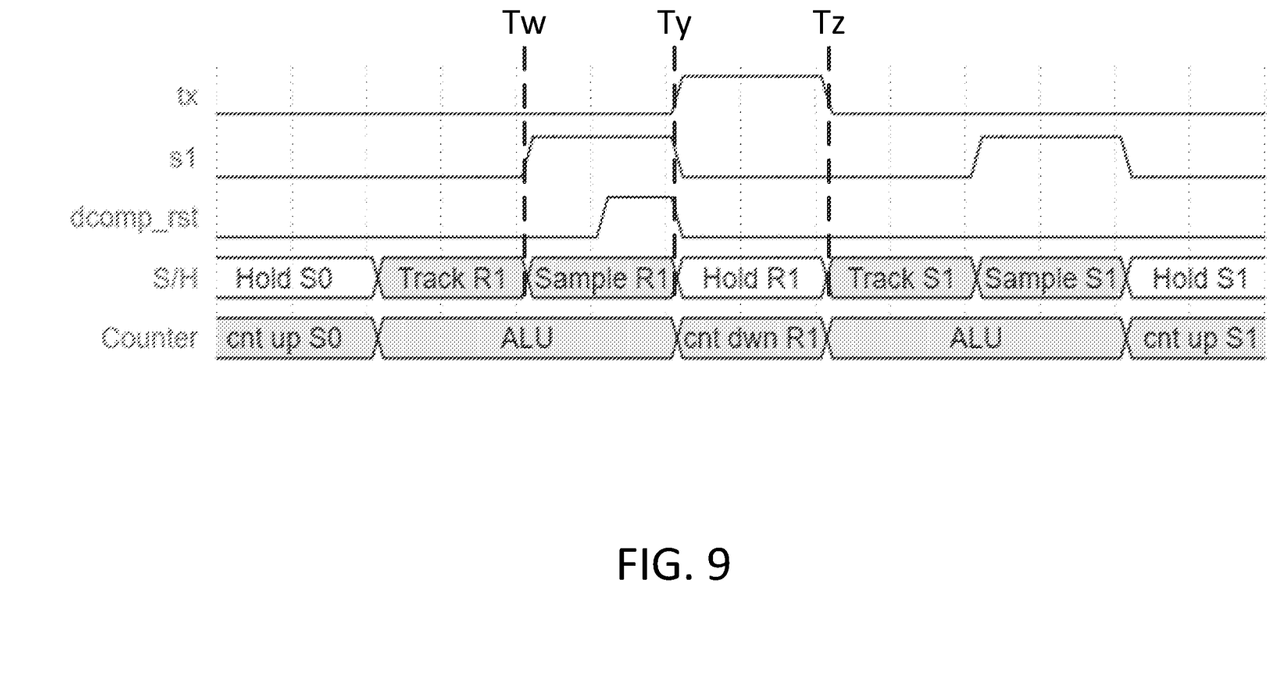
FIG. 9 shows a timing diagram for the circuit of FIGS. 8A, 8B, and 8C.

FIG. 9 shows a timing diagram for the three phases depicted in FIGS. 8A-C. We begin the cycle with the closing of switch s1 (Tw) which starts the sampling of R1. Dcomp_rst is asserted clearing the comparator circuit for the next read out. When dcomp_rst, is dis-asserted, s1 is opened, and tx is asserted at Ty the circuit enters the hold phase.

During the hold phase the sample R1 is converted. S1 is open and the value is counted. The hold phase ends (Tz) with the tracking phase of the next value to be tracked then sampled which is S1. The pattern repeats over and over until the optical array is read. Track, sample, then hold for each sample as it will ping-pong through the optical array.

Figure 10:
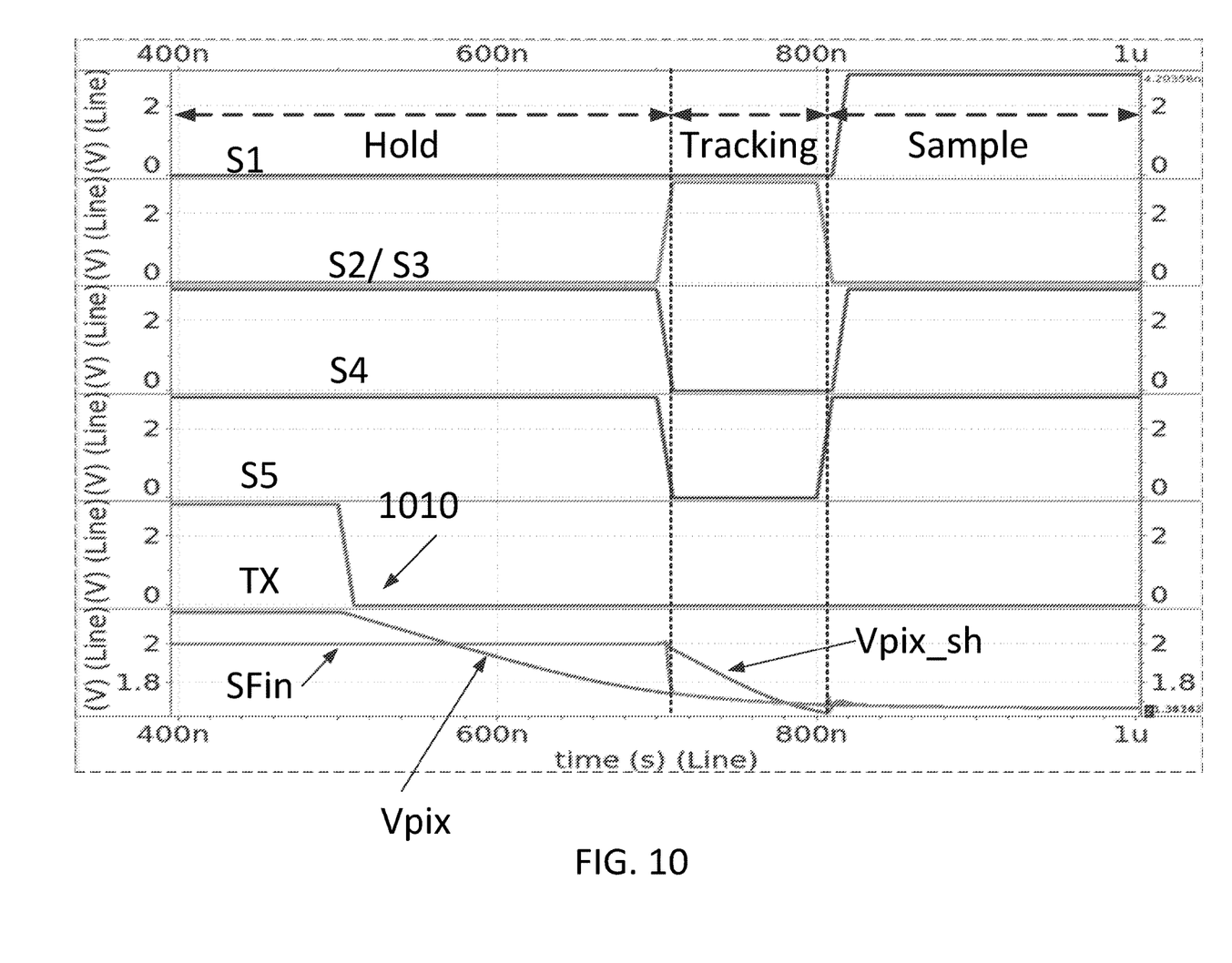
FIG. 10 shows a simulation output for the circuit in FIGS. 8A, 8B, and 8C.

FIG. 10 shows a simulation output for the circuit in FIGS. 8A, 8B, and 8C. The simulation shows the state of switch S1, the state of switch S3 and when switch 830 is connected to S2 (labelled S2). It shows when switch 830 is connected to S4 (labelled S4), and it shows the state of S5. It also shows TX, SFin, Vpix and Vpix_sh. The graphs are divided into three phases showing the Hold Phase as in FIG. 8A, The Tracking Phase as in FIG. 8B and the Sample Phase as in FIG. 8C. During the Hold Phase switch 1 is open. Switch 830 is not connected to S2 and S3 is open. Switch S4 and switch S5 are closed. S5 is closed for a duration long enough for the digital conversion to be accomplished and then is opened so that it is open for only part of the hold phase. When TX ends 1010 during the hold phase, Vpix starts to decay and SFin is maintained at its value. Switch 830 connects to S2 and s3 closes to start the tracking phase. SFin then drops and Vpix_sh is now tracking Vpix. Vpix_sh decays to the new value of Vpix. S1 then closes to start the Sample phase. With the transition of 830 switching to S4 and S3 closing Vpix no longer has a transient or is greatly minimized. The "bump" is suppressed. The difference between the Vpix transient can be seen in FIG. 11.

Figure 11:
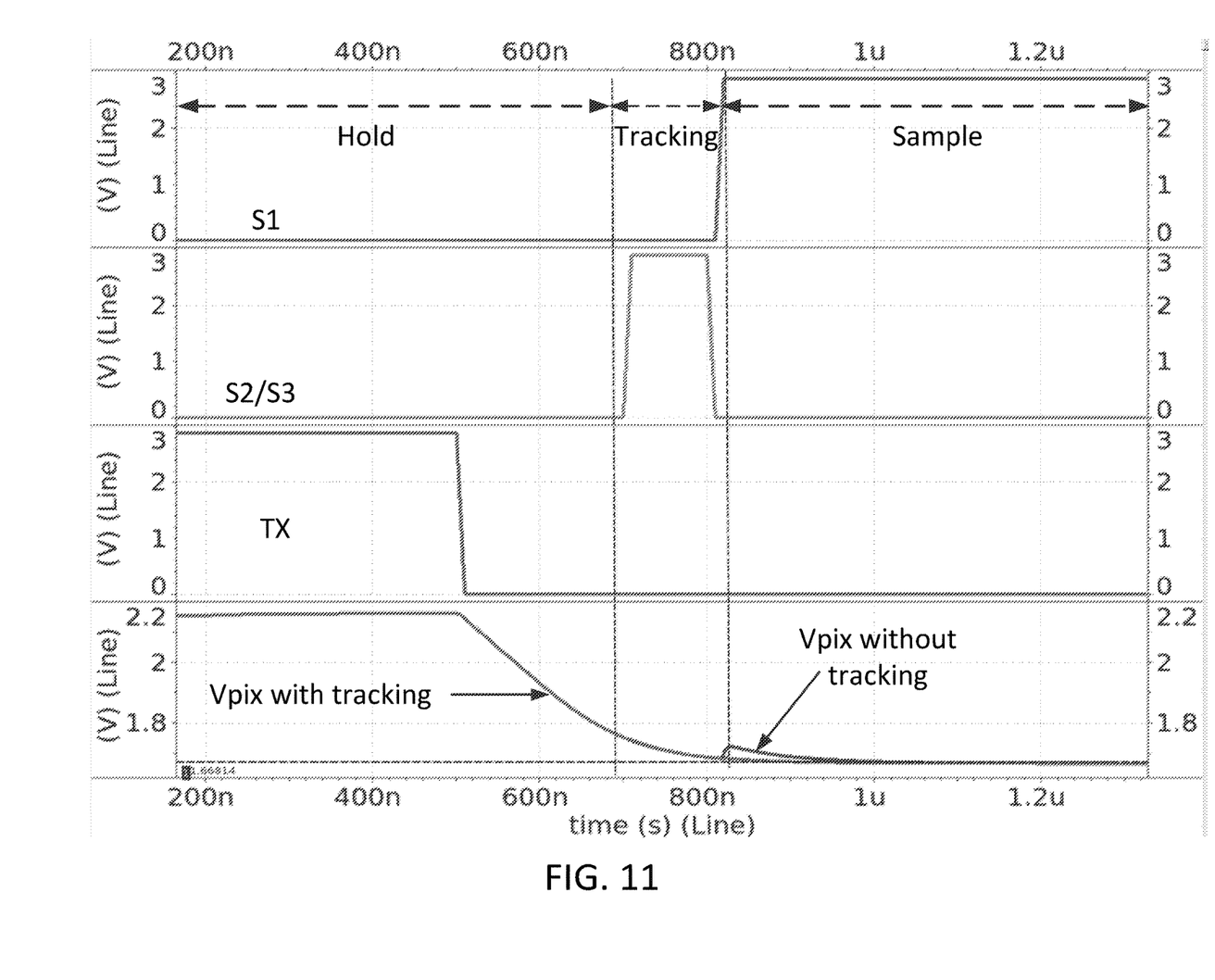
FIG. 11 shows a simulation for the circuit in FIGS. 8A, 8B, and 8C with and without the tracking phase.

FIG. 11 shows a simulation for the circuit in FIGS. 8A, 8B, and 8C with and without the tracking. It shows S1, S3 and when 830 is connected to S2. It also shows Tx and two Vpix waveforms superimposed on each other. The signal Vpix with tracking decays smoothly and transitions from tracking to sample without a transient. It can be seen as a smooth transition. However, the Vpix signal without tracking has a transient during the transition from tracking to sample. During the tracking phase the sample and hold capacitor 820 is charged to the value of Vpix. This occurs because Vpix is electrically coupled to SFin which is an input to a source follower. A source follower has a gain of 1 and is non inverted so that the value at the source will be equal to the voltage at the gate. Since the gate is electrically coupled to Vpix, and the FET has zero threshold voltage, the source will be at the same voltage that of Vpix. When s1 is closed with the transition from tracking to sample there will be no change in voltage because the voltage on the capacitor C is already equal to Vpix.

Circuit selection for the design of the sample and hold circuit dictates that the sample and hold capacitor be small enough to reduce the Johnson-Nyquist noise (kTC noise) to a level below the quantization noise of the DAC used to ramp one side of the comparator. The sample and hold switch should be small enough to minimize the charge injection effect.

Figure 12:
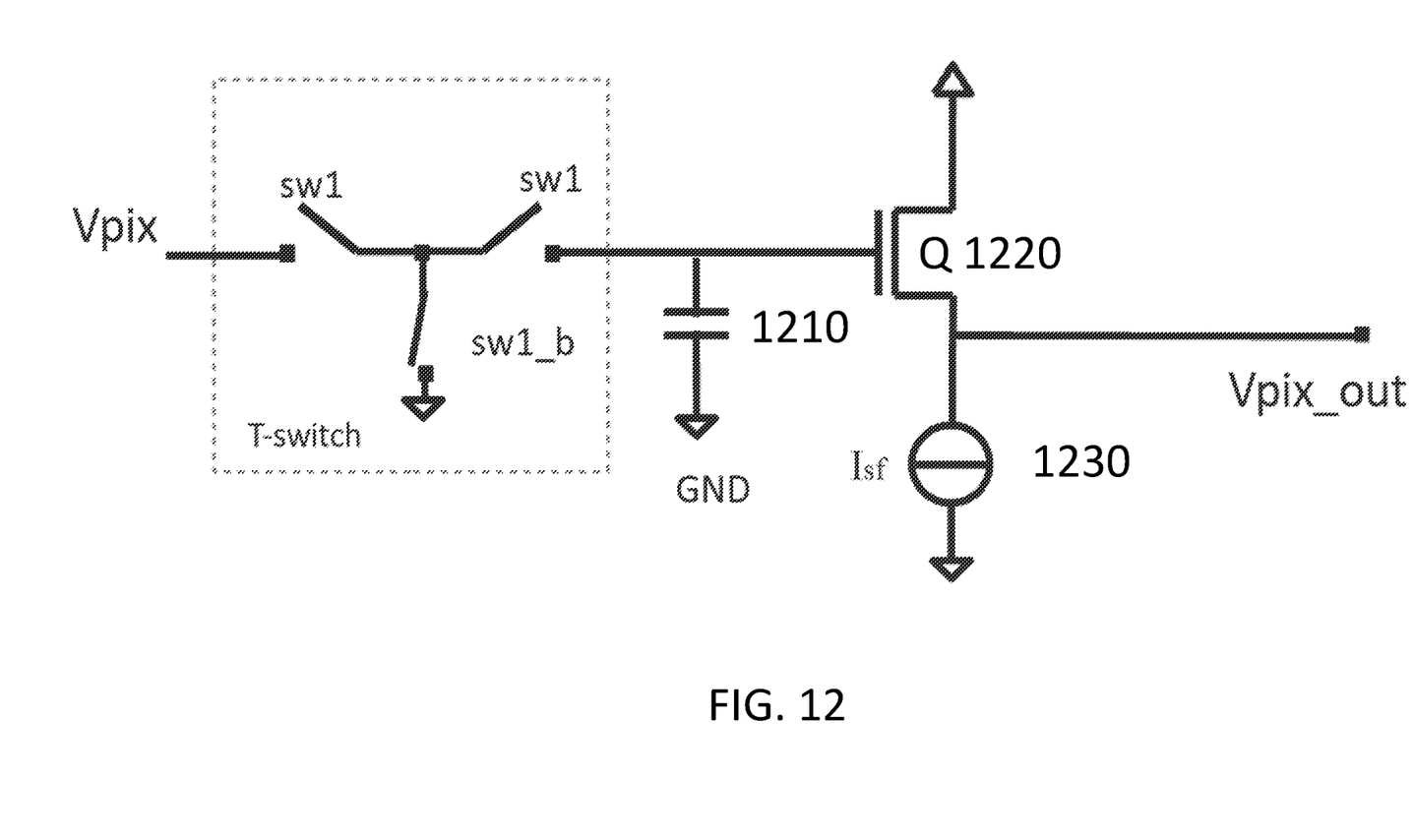
FIG. 12 shows a sample and hold circuit with a "T" switch.

FIG. 12 shows a sample and hold circuit with a "T" switch. A T switch for the sample and hold switch as shown in FIG. 12 may be used. FIG. 12 shows a double sw1 so that either side (of the T) can be electrically coupled, and the center post may be tied to ground. It has an input Vpix a sample and hold capacitor 1210, a transistor Q 1220 biased with a current source 1230 at a magnitude of Isf and the source is also connected to the output Vpix_out. The T-switch can be used for S1 switch to avoid coupling from Vpix to signal to the S/H cap C.

The approaches discussed herein eliminate the problems associated with any mismatches between different capacitors and amplifiers used for the selection of R samples and S samples (SHR and SHS) since all rows are processed with the same circuitry. The size of the circuit is also reduced due to the reduction in capacitor size. It enables conversion because of the faster settling time of $V_{pix}$.

The embodiments presented reduce the row time by pipelining counting period with other pixel operations: TX, reset, settling time and horizontal blanking. The embodiments offer low power, minimal size and mismatch-free between SHR and SHS readout. The embodiments can be implemented for use with sensors which require a sample and hold circuit using a sample and hold readout scheme to speed up the frame rate The sample and hold readout system described herein may incorporate additional features without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated, the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A sample and hold circuit comprising:
   an input to the sample and hold circuit from an optical array output;
   a first switch electrically coupled between an output of the optical array and a sample and hold capacitor;
   a second switch for electrically coupling a gate of a Field Effect Transistor (FET) to one of:
   (a) the sample and hold capacitor; and
   (b) the input to the optical array;
   a third switch for electrically coupling a source of the FET directly to the sample and hold capacitor; and
   a fourth switch for electrically coupling the source of the FET to an output of the sample and hold circuit.

2. The sample and hold circuit of claim 1 wherein FET has zero threshold voltage.

3. The sample and hold circuit of claim 1 wherein the output of the sample and hold circuit is electrically coupled to an analog to digital converter (ADC).

4. The sample and hold circuit of claim 3 wherein the ADC comprises a comparator.

5. The sample and hold circuit of claim 4 wherein the ADC further comprises a coupling capacitor electrically coupled to a first input to the comparator on one end and the capacitor is electrically coupled to the sample and hold circuit output on the other end.

6. The sample and hold circuit of claim 5 wherein the ADC further comprises a fifth switch that is used to reset the capacitor.

7. The sample and hold circuit of claim 6 wherein the ADC further comprises a ramp generator electrically coupled to a second input of the comparator.

8. The sample and hold circuit of claim 7 wherein the ramp generator comprises a digital to analog converter (DAC).

9. The sample and hold circuit of claim 8 wherein the ramp generator further comprises a counter electrically coupled to the digital input to the DAC.

* * * * *